(12) United States Patent
Baek

(10) Patent No.: US 12,648,323 B2
(45) Date of Patent: Jun. 2, 2026

(54) DISPLAY APPARATUS USING AN ORGANIC LAYER WHICH EMITS BLUE LIGHT WITHOUT USING A BLUE COLOR FILTER

(71) Applicant: LG Display Co., Ltd., Seoul (KR)

(72) Inventor: Heumeil Baek, Paju-si (KR)

(73) Assignee: LG Display Co., Ltd. (KR)

( * ) Notice: Subject to any disclaimer, the term of this patent is extended or adjusted under 35 U.S.C. 154(b) by 459 days.

(21) Appl. No.: 18/186,521

(22) Filed: Mar. 20, 2023

(65) Prior Publication Data

US 2023/0329060 A1 Oct. 12, 2023

(30) Foreign Application Priority Data

Mar. 29, 2022 (KR) ......................... 10-2022-0038872

(51) Int. Cl.
*H10K 59/35* (2023.01)
*H10K 59/123* (2023.01)
*H10K 59/38* (2023.01)

(52) U.S. Cl.
CPC ......... *H10K 59/353* (2023.02); *H10K 59/123* (2023.02); *H10K 59/351* (2023.02); *H10K 59/38* (2023.02)

(58) Field of Classification Search
CPC ...... H10K 59/351; H10K 59/32; H10K 50/19; H10K 50/13; H10K 50/125
See application file for complete search history.

(56) References Cited

U.S. PATENT DOCUMENTS

2006/0267021 A1* 11/2006 Rowland .................. H10D 8/80
257/E29.198
2015/0357592 A1* 12/2015 Li ........................ H10K 50/131
257/40

2021/0097943 A1* 4/2021 Wyatt ................. H01L 25/0753
2021/0202606 A1* 7/2021 Kim ...................... H10K 59/351
2021/0350736 A1* 11/2021 Wu ....................... H10K 59/353
2022/0209157 A1* 6/2022 Lee ......................... H10K 59/38
2022/0336766 A1* 10/2022 Ye ........................ H10K 50/131

FOREIGN PATENT DOCUMENTS

| KR | 10-2011-0035048 A | 4/2011 |
| KR | 10-2017-0016028 A | 2/2017 |
| KR | 20170053798 A | 5/2017 |
| KR | 10-2017-0080287 A | 7/2017 |
| KR | 20180062222 A | 6/2018 |
| KR | 20210085981 A | 7/2021 |

OTHER PUBLICATIONS

Office Action in Korean Appln. No. 10-2022-0038872, mailed on Oct. 2, 2025, 21 pages (with English translation).

* cited by examiner

*Primary Examiner* — Chad M Dicke
*Assistant Examiner* — Jeremy Daniel Watts
(74) *Attorney, Agent, or Firm* — Fish & Richardson P.C.

(57) ABSTRACT

A display apparatus includes a substrate including an emission area; a plurality of pixels disposed on the substrate in the emission area; a transistor in each of the plurality of pixels and an anode connected to the transistor; and an organic layer and a cathode on the anode, wherein the organic layer includes a first emission part, a charge generation layer on the first emission part, and a second emission part on the charge generation layer, wherein the first emission part emits light when a reverse driving is performed to the organic layer, and the second emission part emits light when a forward driving is performed to the organic layer.

27 Claims, 10 Drawing Sheets

DISPLAY APPARATUS USING AN ORGANIC LAYER WHICH EMITS BLUE LIGHT WITHOUT USING A BLUE COLOR FILTER

CROSS-REFERENCE TO RELATED APPLICATION

This application claims the priority of Korean Patent Application No. 10-2022-0038872 filed on Mar. 29, 2022, which is hereby incorporated by reference in its entirety.

BACKGROUND

Field of the Disclosure

The present disclosure relates to a display apparatus, and more particularly, to a display apparatus which simplifies a structure of a light emitting diode and a process.

Description of the Background

Among display apparatuses, an organic light emitting diode display is a self-emitting display apparatus which displays an image with an organic light emitting diode which emits light.

The organic light emitting diode using the organic light emitting phenomenon has a structure generally including an anode, a cathode, and an organic material layer interposed therebetween.

Herein, organic layers frequently have a multi-layered structure that includes different materials to enhance efficiency and stability of the organic light emitting diode, and may include, for example, a hole injection layer, a hole transport layer, a light emitting layer, an electron transport layer, an electron injection layer, and the like. In the structure of the organic light emitting diode, if a voltage is applied between two electrodes, holes are injected from an anode and electrons are injected from a cathode into the organic material layer. When the injected holes and electrons meet each other, an exciton is formed, and light is emitted when an energy level of the exciton falls to a bottom state.

In the meantime, a white organic light emitting diode as important elements may have a high efficiency and a long lifespan, but also a color purity, a color stability according to the change in the current and the voltage, and easiness of manufacturing the diode. The white organic light emitting diode is divided into a single layer emission structure and a multi-layered emission structure depending on the structure.

When such a white organic light emitting diode is used, a color filter is formed in an emission direction to display colors.

When the image is displayed using a white organic light emitting diode, a red color filter, a green color filter, and a blue color filter in the organic light emitting display apparatus, there is a problem in that a transmission efficiency of the blue color filter is low.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display apparatus using an organic layer which emits blue light without using a blue color filter.

More specifically, an aspect of the present disclosure is to provide a display apparatus which improves a color stability and simplifies the process by configuring an organic layer with a plurality of emission parts, and disposing an N-type charge generation layer, a P-type charge generation layer, and an N-type charge generation layer to distribute charges generated from a light emitting layer between the emission parts to emit white light or blue light depending on a driving method.

The present disclosure is not limited to the above-mentioned features, and other features, which are not mentioned above, may be clearly understood by those skilled in the art from the following descriptions.

According to an aspect of the present disclosure, a display apparatus includes a substrate including an emission area, each pixel in an emission area, a transistor in each pixel and an anode connected to the transistor and an organic layer and a cathode on the anode, the organic layer includes at least two hole injection layers, and one of the at least two hole injection layers is disposed to be adjacent to the anode and the other one of the at least two hole injection layers is disposed to be adjacent to the cathode.

According to the present disclosure, in an organic light emitting diode OLED with a tandem structure in which an organic layer is configured by a plurality of emission parts, an N type charge generation layer, a P type charge generation layer, and an N type charge generation layer are disposed between the emission parts to emit white light or blue light depending on a driving method.

Other detailed matters of the exemplary aspects are included in the detailed description and the drawings.

Accordingly, a pixel in which a color filter is formed may display a red or green image according to the corresponding color filter and a pixel in which the color filter is not formed may display a blue or white image according to driving method.

By doing this, the blue color filter is not used so that the color stability is improved while displaying the blue image and a blue color filter deposition process is removed to simplify the process.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
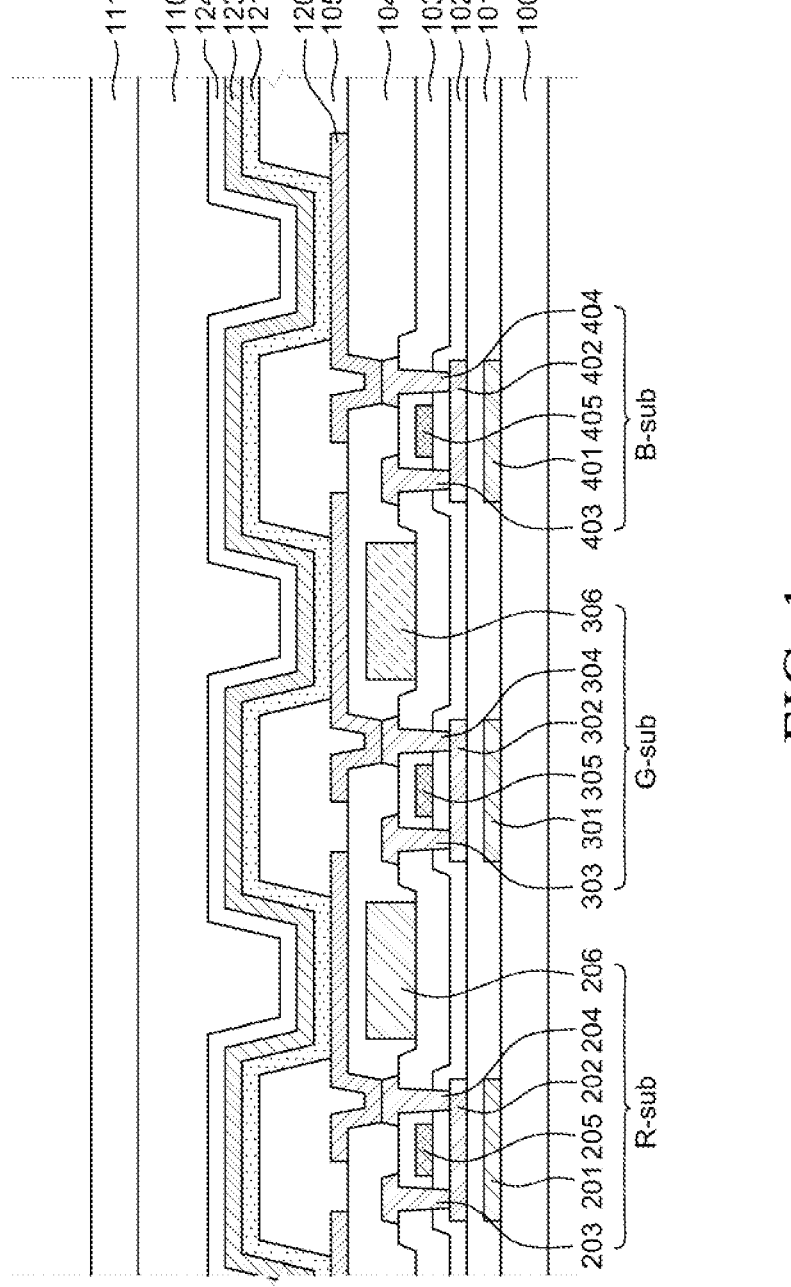
FIG. 1 is a cross-sectional view illustrating a display apparatus according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, the exemplary aspect of the present disclosure will be described in more detail with reference to the accompanying drawings and exemplary aspects as follows.

FIG. 1 is a cross-sectional view illustrating a display apparatus according to an exemplary aspect of the present disclosure.

A display apparatus according to an exemplary aspect of the present disclosure illustrated in FIG. 1 may include a substrate 100. The substrate 100 may include an insulating material. For example, the substrate 100 may include glass or plastic.

Each pixel is located on the substrate 100 and the pixels include a red sub pixel R-sub, a green sub pixel G-sub, and a blue sub pixel B-sub.

The red sub pixel R-sub, the green sub pixel G-sub, and the blue sub pixel B-sub include thin film transistors and the thin film transistors may include light shielding layers 201, 301, and 401 disposed on the substrate 100. The light shielding layers 201, 301, and 401 may include a metal material such as molybdenum (Mo), titanium (Ti), and copper (Cu), and may be formed of a single layer or multiple layers formed of these materials.

A buffer insulating layer 101 may be located on an upper surface and a side surface of the light shielding layers 201, 301, and 401 and an entire surface of the substrate 100 on which the light shielding layers 201, 301, and 401 are not formed. The buffer insulating layer 101 may suppress the contamination due to the substrate 100 in a subsequent process. The buffer insulating layer 101 may include an insulating material. For example, the buffer insulating layer 101 may include a silicon oxide (SiOx)-based material and/or a silicon nitride (SiNx)-based material. For example, the silicon oxide (SiOx)-based material may include silicon dioxide ($SiO_2$). The buffer insulating layer 101 may have a multi-layered structure.

On the buffer insulating layer 101, thin film transistor semiconductor patterns 202, 302, and 402 of the red sub pixel R-sub, the green sub pixel G-sub, and the blue sub pixel B-sub, the gate insulating layer 102, gate electrodes 205, 305, and 405, the interlayer insulating layer 103, source electrodes 203, 303, and 403, and drain electrodes 204, 304, and 404 may be included.

The semiconductor patterns 202, 302, and 402 may include metal oxide such as IGZO and overlap with the light shielding layers 201, 301, and 401.

The semiconductor patterns 202, 302, and 402 may include a source region, a drain region, and a channel region. The source region and the drain region become conductive to be connected to the source electrodes 203, 303, and 403 and the drain electrodes 204, 304, and 404.

The gate insulating layer 102 may be located on the semiconductor patterns 202, 302, and 402. The gate insulating layer 102 may extend to the outside of the semiconductor patterns 202, 302, and 402. For example, side surfaces of the semiconductor patterns 202, 302, and 402 and an upper portion of the buffer insulating layer 101 in which the semiconductor patterns 202, 302, and 402 are not formed may be covered by the gate insulating layer 102.

The gate insulating layer 102 may include an insulating material. For example, the gate insulating layer 102 may include a silicon oxide (SiOx)-based material and/or a silicon nitride (SiNx)-based material. The gate insulating layer 102 may include a material having a high dielectric constant (high-K material).

The gate electrodes 205, 305, and 405 may be disposed on the gate insulating layer 102. The gate electrodes 205, 305, and 405 may overlap with a channel region of the semiconductor patterns 202, 302, and 402. For example, the gate electrodes 205, 305, and 405 may be insulated from the semiconductor patterns 202, 302, and 402 by the gate insulating layer 102.

The gate electrodes 205, 305, and 405 may include a conductive material. The gate electrodes 205, 305, and 405 may include a hydrogen barrier material. The hydrogen barrier material may include a hydrogen storage material and a hydrogen blocking material. For example, the gate electrodes 205, 305, and 405 may include titanium (Ti) or tantalum (Ta). Further, the gate electrode may include a metal material having a low resistance. For example, the gate electrodes 205, 305, and 405 may include molybdenum (Mo), copper (Cu), aluminum (Al), and the like and may be formed by a single layer or multiple layers formed of these materials.

The interlayer insulating layer 103 may be located on the gate insulating layer 102 and the gate electrodes 205, 305, and 405. The interlayer insulating layer 103 may include an insulating material. For example, the interlayer insulating layer 103 may include a silicon oxide (SiOx)-based material and/or a silicon nitride (SiNx)-based material. For example, the silicon oxide (SiOx)-based material may include silicon dioxide ($SiO_2$). The interlayer insulating layer 103 may have a multi-layered structure.

The source electrodes 203, 303, and 403 and the drain electrodes 204, 304, and 404 may be located on the interlayer insulating layer 103. The source electrodes 203, 303, and 403 and the drain electrodes 204, 304, and 404 may be electrically connected to the source region and the drain region of the semiconductor patterns 202, 302, and 402. The source electrodes 203, 303, and 403 and the drain electrodes 204, 304, and 404 may include metal, such as aluminum (Al), chrome (Cr), molybdenum (Mo), tungsten (W), and copper (Cu), but exemplary aspects of the present disclosure are not limited thereto.

In emission regions of the red sub pixel R-sub and the green sub pixel G-sub, a red color filter 206 and a green color filter 306 are respectively located on the interlayer insulating layer 103. More specifically, the red color filter 206 may be disposed on the interlayer insulating layer 103 in the emission regions of the red sub pixel R-sub, and green color filter 306 may be disposed on the interlayer insulating layer 103 in the emission regions of the green sub pixel G-sub. In addition, no color filter may be disposed on the interlayer insulating layer 103 in the emission regions of the blue sub pixel B-sub.

An overcoating layer 104 may be located on the red color filter 206, the green color filter 306, and the interlayer insulating layer 103. The overcoating layer 104 may remove a step generated by the thin film transistor and the color filter to suppress external impact and planarize the emission area. The overcoating layer 104 extends along the interlayer insulating layer 103 to cover the thin film transistor and the red color filter 206 and the green color filter 306. For example, the overcoating layer 104 extends along the interlayer insulating layer 103 to fully cover the thin film transistor and the red color filter 206 and the green color filter 306.

The overcoating layer 104 may include an insulating material. The overcoating layer 104 may include a material different from that of the interlayer insulating layer 103. The overcoating layer 104 may include a material having a relatively high fluidity. For example, the overcoating layer 104 may include an organic insulating material.

An anode electrode 120 may be located on the overcoating layer 104. The anode electrode 120 may be formed of a transparent conductive material. For example, the anode electrode may be formed of ITO and IZO. Alternatively, the anode electrode may be formed of an alloy or a multiple layer of a material including silver (Ag), magnesium (Mg), and ytterbium (Yb), but the exemplary aspects of the present disclosure are not limited thereto.

The anode electrode 120 is connected to drain electrodes 204, 304, and 404 of the thin film transistors of the red sub pixel R-sub, the green sub pixel G-sub, and the blue sub pixel B-sub and may be located in the emission area. For example, the interlayer insulating layer 103 and the overcoating layer 104 may include pixel contact holes which partially expose the drain electrodes 204, 304, and 404 of the thin film transistors of the red sub pixel R-sub, the green sub pixel G-sub, and the blue sub pixel B-sub. The anode electrode 120 may include a region overlapping with the drain electrodes 204, 304, and 404. Accordingly, in the display apparatus according to the exemplary aspect of the present disclosure, a driving current generated by the thin film transistor may be supplied to the anode 120.

On the anode 120, a bank 105 may be formed in a portion excluding the emission area of the red sub pixel R-sub, the green sub pixel G-sub, and the blue sub pixel B-sub. The bank 105 may overlap with an end (or one side) of the anode 120 and overlap with the transistors of the red sub pixel R-sub, the green sub pixel G-sub, and the blue sub pixel B-sub.

The bank 105 may be formed of an organic insulating material which may be a transparent or black organic insulating material.

The organic layer 121 and the cathode 123 may be formed on the bank 105 and the anode 120. The organic layer 121 and the cathode 123 are formed as common layers and may generate light having a luminance corresponding to a voltage difference between the anode 120 and the cathode 123.

The cathode 123 may include a conductive material. The cathode 123 may include a material different from that of the anode 120. The cathode 123 may include a metal having a relatively high reflectance and may be formed of silver (Ag), gold (Au), aluminum (Al), magnesium (Mg), silver-magnesium (Ag:Mg), and the like, or formed of a single layer thereof or an alloy thereof, but is not limited thereto. For example, the alloy may be an aluminum alloy (Al alloy), but is not limited thereto.

In the present disclosure, the bottom emission type in which the light is emitted toward the substrate 100 has been described as an exemplary aspect, but it is not limited thereto. In the case of the top emission type, the anode 120 may be a metal having a high reflectance and the cathode 123 may be a transparent metal.

Further, in the case of the top emission type, the red color filter 206 and the green color filter 306 may be disposed above the cathode 123.

The red color filter 206 and the green color filter 306 may be organic materials including a color pigment and a dye and may be a quantum dot material including a color pigment and a dye.

A capping layer 124, a first encapsulation layer 110, and a second encapsulation layer 111 may be located on the cathode 123 to suppress the damage of the organic layer 121 due to the external impact and moisture.

The capping layer 124 may be formed of a thin metal layer including aluminum (Al) or an organic material. The first encapsulation layer 110 is an encapsulation layer which suppresses the moisture permeation and may be formed of epoxy and olefin. The second encapsulation layer 111 may be formed of a metal layer including iron (Fe) and nickel (Ni).

Figure 2:
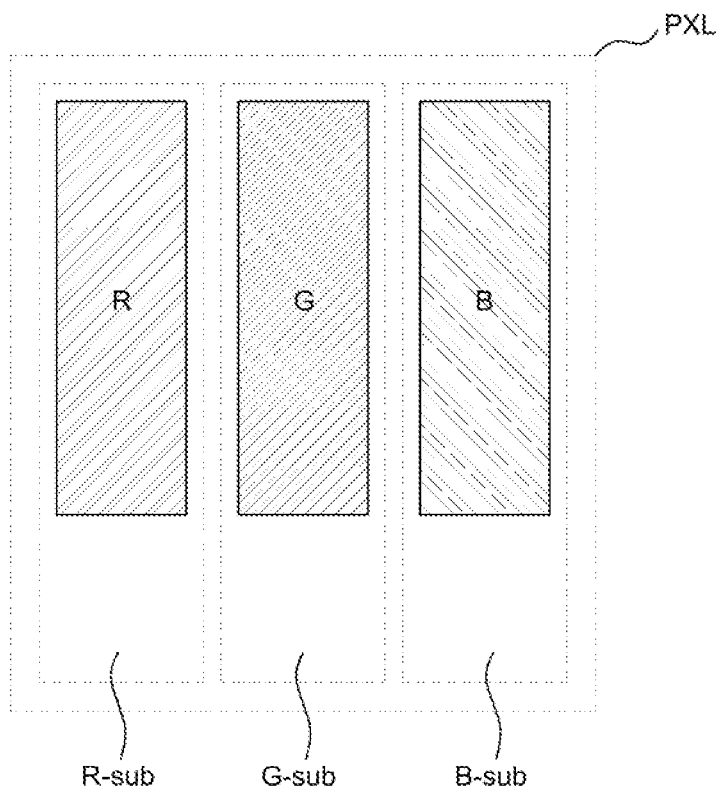
FIG. 2 is a plan view illustrating a display apparatus according to a first exemplary aspect of the present disclosure.

FIG. 2 is a plan view illustrating a display apparatus according to a first exemplary aspect of the present disclosure.

FIG. 2 is a view illustrating a plan view of a pixel of FIG. 1. A pixel PXL of the emission area of the substrate 100 may be formed of a red sub pixel R-sub, a green sub pixel G-sub, and a blue sub pixel B-sub, the red sub pixel R-sub displays red, the green sub pixel G-sub displays green, and the green sub pixel G-sub displays blue.

Figure 3:
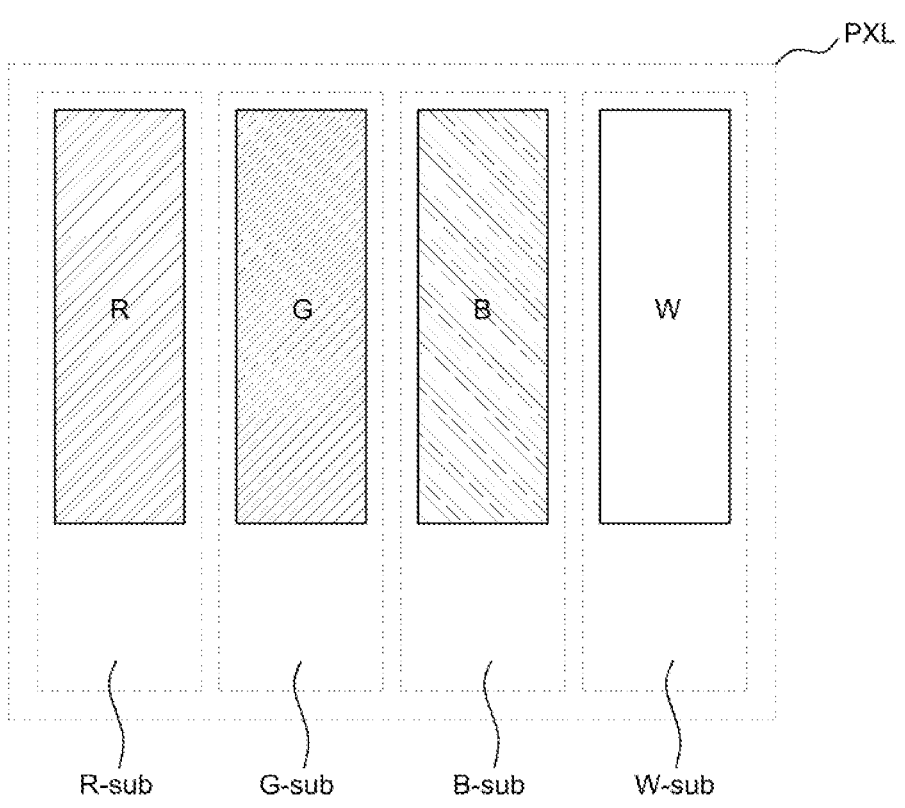
FIG. 3 is a plan view illustrating another display apparatus according to a first exemplary aspect of the present disclosure.

FIG. 3 is a plan view illustrating another display apparatus according to a first exemplary aspect of the present disclosure.

That is, FIG. 3 is a view illustrating a plan view of another pixel PXL according to a first exemplary aspect of the present disclosure. A pixel PXL of the emission area of the substrate 100 may be formed of a red sub pixel R-sub, a green sub pixel G-sub, a blue sub pixel B-sub, and a white sub pixel W-sub, the red sub pixel R-sub displays red, the green sub pixel G-sub displays green, the blue sub pixel B-sub displays blue, and the white sub pixel W-sub displays white. At this time, the white sub pixel W-sub does not include a color filter, like the blue sub pixel B-sub.

Figure 4:
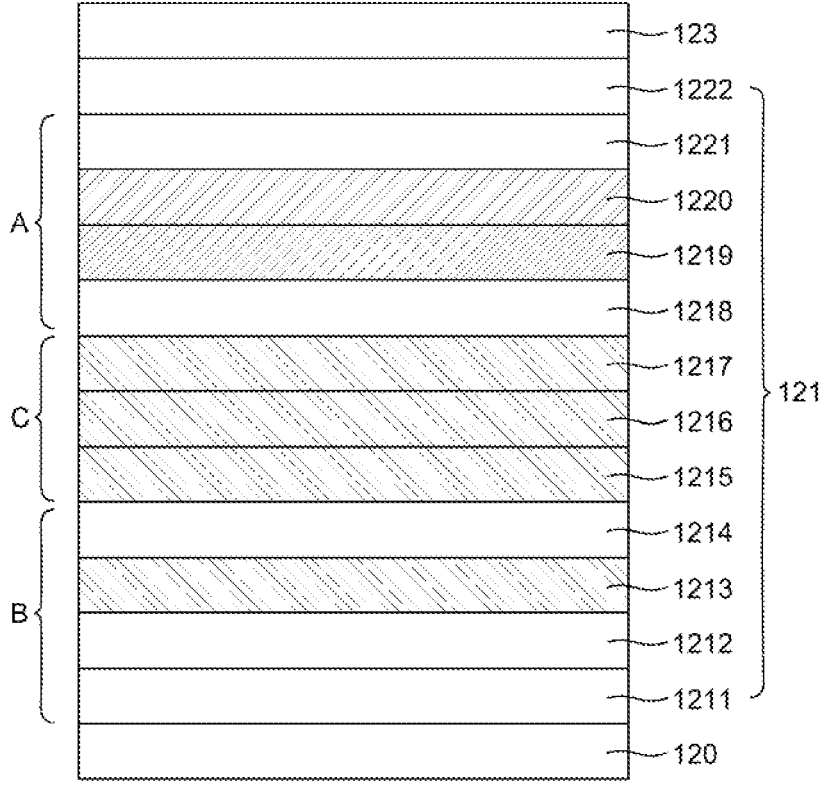
FIG. 4 is a view illustrating an organic layer according to a first exemplary aspect of the present disclosure.
Figure 5A:
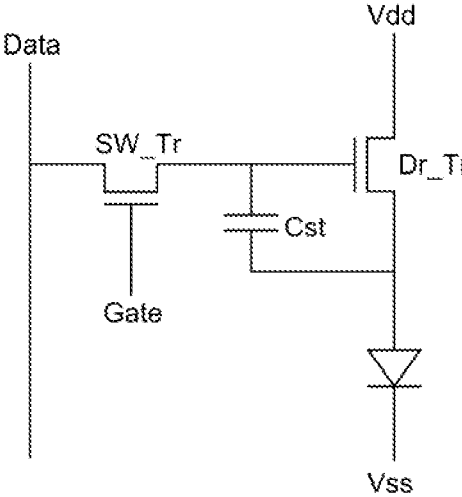
FIG. 5A is a forward driving circuit diagram illustrating a display apparatus according to a first exemplary aspect of the present disclosure.
Figure 5B:
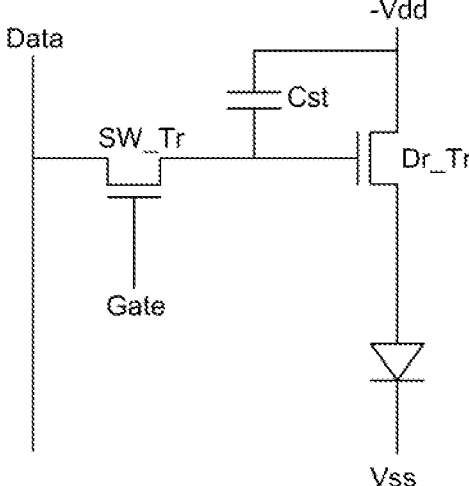
FIG. 5B is a reverse driving circuit diagram illustrating a display apparatus according to a first exemplary aspect of the present disclosure.
Figure 6:
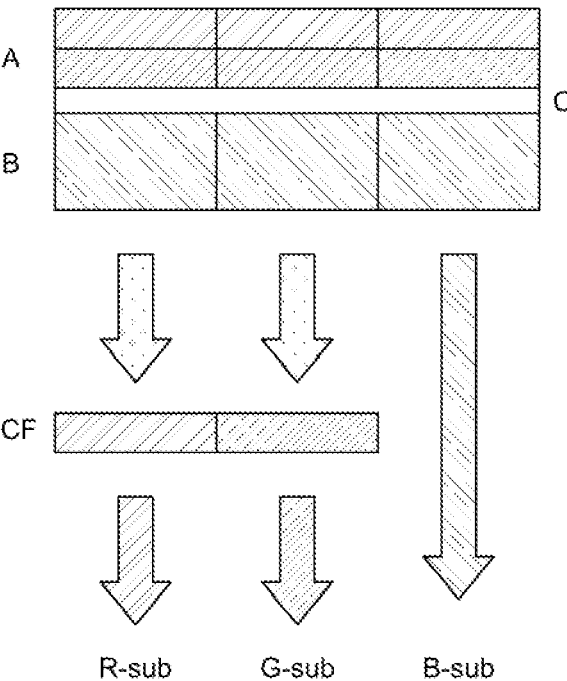
FIG. 6 is a cross-sectional view illustrating a light emitting diode according to a first exemplary aspect of the present disclosure.

FIG. 4 is a view illustrating an organic layer 121 according to a first exemplary aspect of the present disclosure, FIGS. 5A and 5B are driving circuit diagrams of the present disclosure, and FIG. 6 is a schematic cross-sectional view illustrating an organic light emitting diode according to a first exemplary aspect of the present disclosure.

An organic layer 121 may include a first emission part B and a second emission part A and a charge generation layer C located between the first emission part B and the second emission part A. The first emission part B may include a first hole injection layer (HIL) 1211, a first hole transport layer (HTL) 1212, a first light emitting layer 1213, and a first electron transport layer (ETL) 1214 on the anode 120.

The second emission part A may include a second electron transport layer (ETL) 1218, a second light emitting layer 1219, a third light emitting layer 1220, a second hole transport layer (HTL), and a second hole injection layer (HIL) 1222.

The charge generation layer C may be formed by sequentially laminating a first N type charge generation layer 1215, a first P type charge generation layer 1216, and a second N type charge generation layer 1217. The first N-type charge generating layer 1215 and the second N type charge generation layer 1217 may be formed of an organic layer doped with an alkali metal, such as lithium (Li), sodium (Na), potassium (K), or cesium (Cs), or an alkali earth metal, such as magnesium (Mg), strontium (Sr), barium (Ba), or radium (Ra), as hosts, but is not necessarily limited thereto. Further, the first P type charge generation layer 1216 is configured by at least one host and a P type dopant which is at least one dopant. For example, the P type dopant may be at least one of F4-TCNQ (2,3,5,6-tetrafluoro-7,7,8,8-tetracyano-quinodimethane), FeCl3, FeF3, and SbCl5, but is not limited thereto. For example, the host may be at least one of NPB(N,N'-bis(naphthaen-1-yl)-N,N'-bis(phenyl)-benzidine), TPD (N,N'-bis(3-methylphenyl)-N,N'-bis(phenyl)-benzidine), and TNB (N,N,N',N'-tetra-naphthalenyl-benzidine), but is not limited thereto.

FIG. 5A is a circuit diagram for forward driving of the present disclosure. As a driving data voltage Vdd of the blue sub pixel B-sub, approximately 15 to 25 V is applied and the cathode 123 applies a cathode voltage Vss of 0 V to enable the forward driving. Therefore, holes are injected to the first light emitting layer 1213 through the first hole injection layer 1211 and the first hole transport layer 1212 and electrons are injected from the first N type charge generation layer 1215 to the first light emitting layer 1213. Accordingly, electrons and holes are coupled in the first light emitting layer 1213 to generate light. At this time, holes are injected to the second N type charge generation layer 1217 from the first P type charge generation layer 1216 and the electrons are injected to the first P type charge generation layer 1216 from the second N type charge generation layer 1217. Accordingly, electrons and holes generated in the first P type charge generation layer 1216 and the second N type charge generation layer 1217 meet to be cancelled. Therefore, the electrons and holes do not move to the second emission part A so that the emission is not generated in the second emission part A.

The first light emitting layer 1213 may include one of a blue light emitting layer, a deep blue light emitting layer, and a sky blue light emitting layer so that light emitted from the first light emitting layer 1213 according to the forward driving of the blue sub pixel B-sub is emitted through the blue sub pixel B-sub of FIG. 6. Accordingly, a blue image with an emission wavelength range of 440 nm to 480 nm may be displayed.

FIG. 5B is a circuit diagram for a reverse driving of the present disclosure. As a driving data voltage Vdd of the red sub pixel R-sub and the green sub pixel G-sub, approximately −15 V to −25 V is applied and the cathode 123 applies a cathode voltage Vss of 0 V to enable the reverse driving. Therefore, the electrons are supplied from the second N type charge generation layer 1217 and the second electron transport layer 1218 to the second light emitting layer 1219 and the third light emitting layer 1220. The holes are injected from the second hole injection layer 1222 and the second hole transport layer 1221 to the second light emitting layer 1219 and the third light emitting layer 1220. Accordingly, the electrons and holes are coupled in the second light emitting layer 1219 and the third light emitting layer 1220 to generate light. The second light emitting layer 1219 includes a red light emitting layer having an emission wavelength range of 600 nm to 700 nm, the third light emitting layer 1220 includes a green or green-yellow light emitting layer having an emission wavelength range of 510 nm to 590 nm. Accordingly, light of the second light emitting layer 1219 and the third light emitting layer 1220 is mixed to generate yellow-white light. At this time, holes are injected to the first N type charge generation layer 1215 from the first P type charge generation layer 1216 and the electrons are injected to the first P type charge generation layer 1216 from the first N type charge generation layer 1215. Accordingly, electrons and holes generated in the first P type charge generation layer 1216 and the first N type charge generation layer 1215 meet to be cancelled. Therefore, the electrons and holes do not move to the first emission part B so that the emission is not generated in the first emission part B.

The yellow-white light generated by the reverse driving of the red sub pixel R-sub and the green sub pixel G-sub passes through the color filters of the red sub pixel R-sub and the green sub pixel G-sub of FIG. 6 to display red and green images.

Figure 7:
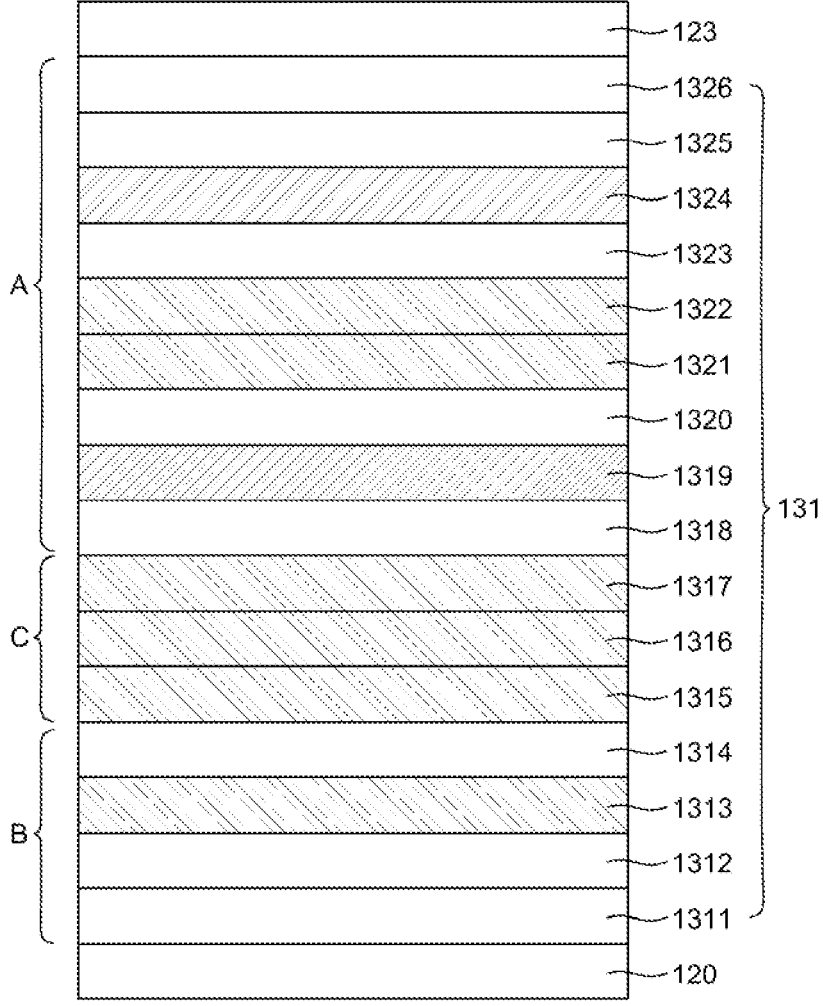
FIG. 7 is a view illustrating a light emitting diode according to a second exemplary aspect of the present disclosure.

FIG. 7 is a view illustrating an organic layer 131 according to a second exemplary aspect of the present disclosure.

In the second exemplary aspect, the structure and the driving method of the first emission part B are the same as those in the first exemplary aspect. In the description of the present exemplary aspect, the description of the same or corresponding components of the previous exemplary aspect may be omitted or briefly performed.

An organic layer 131 may include a first emission part B and a second emission part A and a charge generation layer C located between the first emission part B and the second emission part A. The first emission part B may include a first hole injection layer (HIL) 1311, a first hole transport layer (HTL) 1312, a first light emitting layer 1313, and a first electron transport layer (ETL) 1314 on the anode 120.

The second emission part A may include a second electron transport layer (ETL) 1318, a second light emitting layer 1319, a second hole transport layer (HTL) 1320, a second P type charge generation layer 1321, a third N-type charge generation layer 1322, a third electron transport layer (ETL) 1323, a third light emitting layer 1324, a third hole transport layer (HTL) 1325, and a second hole injection layer (HIL) 1326.

The charge generation layer C may be formed by sequentially laminating a first N type charge generation layer 1315, a first P type charge generation layer 1316, and a second N type charge generation layer 1317.

As illustrated in a circuit diagram for a forward driving of the present disclosure of FIG. 5A, as a driving data voltage Vdd of approximately 15 to 25 V is applied to the blue sub pixel B-sub, and the cathode 123 applies a cathode voltage Vss of 0 V to enable the forward driving. Therefore, holes are injected to the first light emitting layer 1313 through the first hole injection layer 1311 and the first hole transport layer 1312 and electrons are injected from the first N type charge generation layer 1315 to the first light emitting layer 1313. Accordingly, electrons and holes are coupled in the first light emitting layer 1313 to generate light. At this time, holes are injected to the second N type charge generation layer 1317 from the first P type charge generation layer 1316 and the electrons are injected to the first P type charge generation layer 1316 from the second N type charge generation layer 1317. Accordingly, electrons and holes generated in the first P type charge generation layer 1316 and the second N type charge generation layer 1317 meet to be cancelled. Therefore, the electrons and holes do not move to the second emission part A so that the emission is not generated in the second emission part A.

The first light emitting layer 1313 may include one of a blue light emitting layer, a deep blue light emitting layer, and a sky blue light emitting layer so that light emitted from the first light emitting layer 1313 according to the forward driving of the blue sub pixel B-sub is emitted through the blue sub pixel B-sub. Accordingly, a blue image with an emission wavelength range of 440 nm to 480 nm may be displayed.

Further, as illustrated in a circuit diagram of reverse driving of the present disclosure of FIG. 5B, a driving data voltage Vdd of approximately −15 V to −25 V is applied to the red sub pixel R-sub and the green sub pixel G-sub and the cathode 123 applies a cathode voltage Vss of 0 V to enable the reverse driving. By doing this, the electrons are supplied from the second N type charge generation layer 1317 and the second electron transport layer 1318 to the second light emitting layer 1319 and the third hole transport layer 1325 and the fourth hole injection layer 1326 supply the holes to the third light emitting layer 1324. At this time, the second hole transport layer 1320, the second P type charge generation layer 1321, the third N type charge generation layer 1322, and the third electron transport layer 1323 are located between the second light emitting layer 1319 and the third light emitting layer 1324 of the second emission part A. The second P type charge generation layer 1321 and the third N type charge generation layer 1322 control charge balance of the second light emitting layer 1319 and the third light emitting layer 1324.

The second P type charge generation layer 1321 serves to inject holes to the second light emitting layer 1319. The third N type charge generation layer 1322 serves to inject electrons to the third light emitting layer 1324. By doing this, after emitting color light from the second light emitting layer 1319 and the third light emitting layer 1324, respectively, colors are mixed to emit light having a higher luminance.

The second light emitting layer 1319 may be configured to include one of a yellow-green light emitting layer and a green light emitting layer having an emission wavelength range of 510 nm to 590 nm and the third light emitting layer 1324 may include a red light emitting layer having an emission wavelength range of 600 nm to 700 nm.

Light of the second light emitting layer 1319 and the third light emitting layer 1324 is mixed to generate yellow-white light. At this time, holes are injected to the first N type charge generation layer 1315 from the first P type charge generation layer 1316 and the electrons are injected to the first P type charge generation layer 1316 from the first N type charge generation layer 1315. Accordingly, electrons and holes generated in the first P type charge generation layer 1316 and the first N type charge generation layer 1315 meet to be cancelled. Therefore, the electrons and holes do not move to the first emission part B so that the emission is not generated in the first emission part B.

The yellow-white light generated by the reverse driving of the red sub pixel R-sub and the green sub pixel G-sub passes through the color filters of the red sub pixel R-sub and the green sub pixel G-sub may display red and green images.

Figure 8:
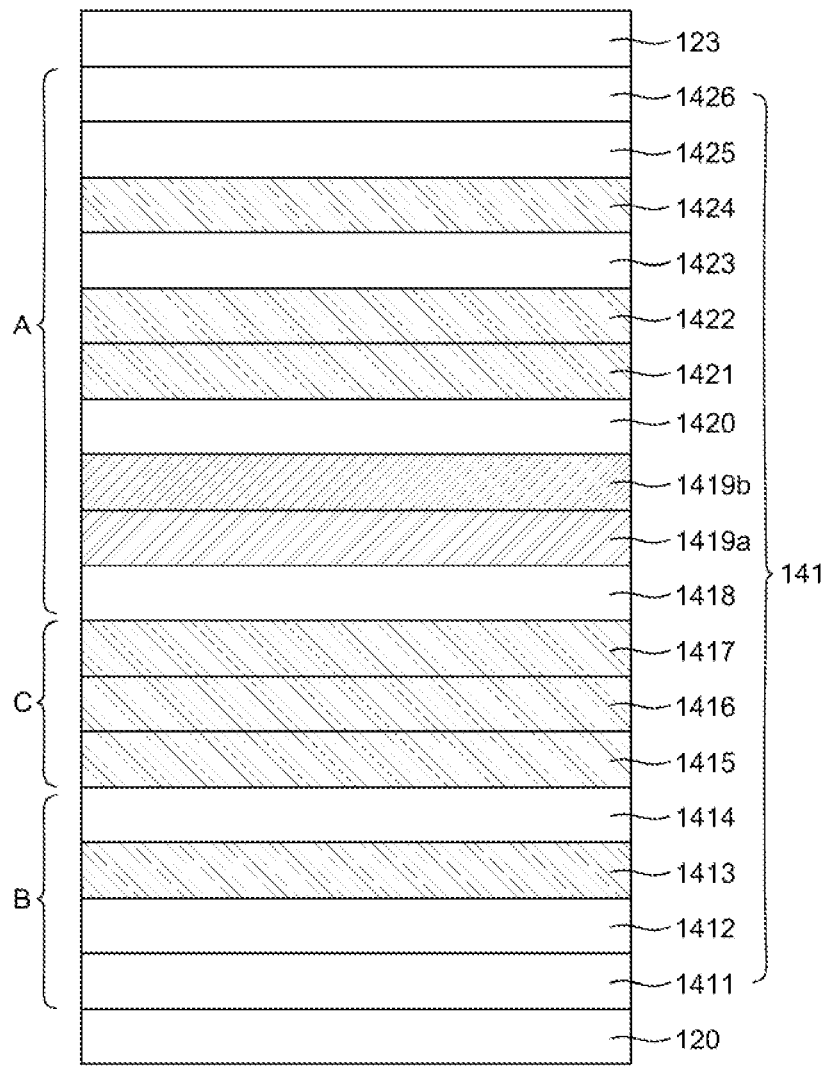
FIG. 8 is a view illustrating a light emitting diode according to a third exemplary aspect of the present disclosure.

FIG. 8 is a view illustrating an organic layer 141 according to a third exemplary aspect of the present disclosure.

In the third exemplary aspect, the structure and the driving method of the first emission part B are the same as those in the second exemplary aspect. In the description of the present exemplary aspect, the description of the same or corresponding components of the previous exemplary aspect may be omitted or briefly performed.

An organic layer 141 includes a first emission part B and a second emission part A and a charge generation layer C may be located between the first emission part B and the second emission part A. The first emission part B may include a first hole injection layer (HIL) 1411, a first hole transport layer (HTL) 1412, a first light emitting layer 1413, and a first electron transport layer (ETL) 1414 on the anode 120.

The second emission part A may include a second electron transport layer (ETL) 1418, a second light emitting layer 1419a, a third light emitting layer 1419b, a second hole transport layer (HTL) 1420, a second P type charge generation layer 1421, a third N-type charge generation layer 1422, a third electron transport layer (ETL) 1423, a fourth light emitting layer 1424, a third hole transport layer (HTL) 1425, and a second hole injection layer (HIL) 1426.

The charge generation layer C may be formed by sequentially laminating a first N type charge generation layer 1415, a first P type charge generation layer 1416, and a second N type charge generation layer 1417.

As illustrated in a circuit diagram for forward driving of the present disclosure of FIG. 5A, a driving data voltage Vdd of approximately 15 V to 25 V is applied to the blue sub pixel B-sub and the cathode 123 applies a cathode voltage Vss of 0 V to enable the forward driving. Therefore, holes are injected to the first light emitting layer 1413 through the first hole injection layer 1411 and the first hole transport layer 1412 and electrons are injected from the first N type charge generation layer 1415 and the first electron transport layer (ETL) 1414 to the first light emitting layer 1413. Accordingly, electrons and holes are coupled in the first light emitting layer 1413 to generate light. At this time, holes are injected to the second N type charge generation layer 1417 from the first P type charge generation layer 1416 and the electrons are injected to the first P type charge generation layer 1416 from the second N type charge generation layer 1417. Accordingly, electrons and holes generated in the first P type charge generation layer 1416 and the second N type charge generation layer 1417 meet to be cancelled. Therefore, the electrons and holes do not move to the second emission part A so that the emission is not generated in the second emission part A.

The first light emitting layer 1413 may include one of a blue light emitting layer, a deep blue light emitting layer, and a sky blue light emitting layer so that light emitted from the first light emitting layer 1413 according to the forward driving of the blue sub pixel B-sub is emitted through the blue sub pixel B-sub. Accordingly, a blue image with an emission wavelength range of 440 nm to 480 nm may be displayed.

Further, as illustrated in a circuit diagram of reverse driving of the present disclosure of FIG. 5B, a driving data voltage Vdd of approximately −15 V to −25 V is applied to the red sub pixel R-sub, the green sub pixel G-sub, and the white sub pixel W-sub and the cathode 123 applies a cathode voltage Vss of 0 V to enable the reverse driving. By doing this, the electrons are supplied from the second N type charge generation layer 1417 and the second electron transport layer 1418 to the second light emitting layer 1419*a* and the third light emitting layer 1419*b* and the third hole transport layer 1425 and the fourth hole injection layer 1426 supply the holes to the fourth light emitting layer 1424. At this time, a second hole transport layer 1420, a second P type charge generation layer 1421, a third N type charge generation layer 1422, and a third electron transport layer 1423 are located between the third light emitting layer 1419*b* and the fourth light emitting layer 1424 of the second emission part A. The second P type charge generation layer 1321 and the third N type charge generation layer 1322 control charge balance of the second light emitting layer 1419*a*, the third light emitting layer 1419*b*, and the fourth light emitting layer 1424.

The second P type charge generation layer 1421 serves to inject holes to the second light emitting layer 1419*a* and the third light emitting layer 1419*b*. The third N type charge generation layer 1422 serves to inject electrons to the fourth light emitting layer 1424. By doing this, after emitting color light from the second light emitting layer 1419*a*, the third light emitting layer 1419*b*, and the fourth light emitting layer 1424, respectively, colors are mixed to emit light having a higher luminance.

The second light emitting layer 1419*a* may include a red light emitting layer having an emission area of 600 nm to 700 nm and the third light emitting layer 1419*b* may include one of a yellow-green light emitting layer and a green light emitting layer having an emission area of 510 nm to 590 nm. The fourth light emitting layer 1424 may include a blue light emitting layer, a deep blue light emitting layer, or a sky blue light emitting layer having an emission area of 440 nm to 480 nm. Light of the second light emitting layer 1419*a*, the third light emitting layer 1419*b*, and the fourth light emitting layer 1424 is mixed to generate white light. At this time, holes are injected to the first N type charge generation layer 1415 from the first P type charge generation layer 1416 and the electrons are injected to the first P type charge generation layer 1416 from the first N type charge generation layer 1415. Accordingly, electrons and holes generated in the first P type charge generation layer 1416 and the first N type charge generation layer 1415 meet to be cancelled. Therefore, the electrons and holes do not move to the first emission part B so that the emission is not generated in the first emission part B.

White light generated by the reverse driving of the red sub pixel R-sub, the green sub pixel G-sub, and the white sub pixel W-sub passes through the color filters of the red sub pixel R-sub and the green sub pixel G-sub to display red and green images and passes through the white sub pixel W-sub to display a white image.

Figure 9:
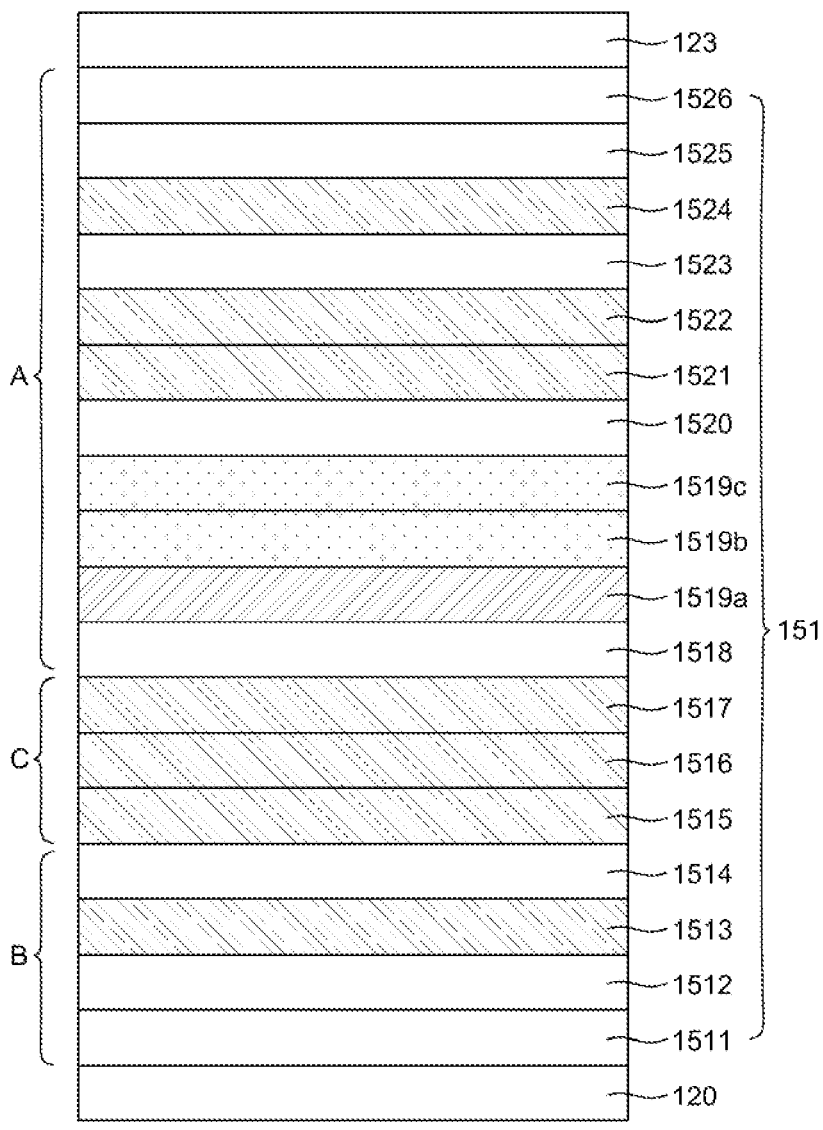
FIG. 9 is a view illustrating a light emitting diode according to a fourth exemplary aspect of the present disclosure.

FIG. 9 is a view illustrating a light emitting diode layer 151 according to a fourth exemplary aspect of the present disclosure.

In the fourth exemplary aspect, the structure and the driving method of the first emission part B are the same as those in the third exemplary aspect. In the description of the present exemplary aspect, the description of the same or corresponding components of the previous exemplary aspect may be omitted or briefly performed.

An organic layer 151 may include a first emission part B and a second emission part A and a charge generation layer C may be located between the first emission part B and the second emission part A. The first emission part B may include a first hole injection layer (HIL) 1511, a first hole transport layer (HTL) 1512, a first light emitting layer 1513, and a first electron transport layer (ETL) 1514 on the anode 120.

The second emission part A may include a second electron transport layer (ETL) 1518, a second light emitting layer 1519*a*, a third light emitting layer 1519*b*, a fourth light emitting layer 1519*c*, a second hole transport layer (HTL) 1520, a second P type charge generation layer 1521, a third N-type charge generation layer 1522, a third electron transport layer (ETL) 1523, a fifth light emitting layer 1524, a third hole transport layer (HTL) 1525, and a second hole injection layer (HIL) 1526.

The charge generation layer C may be formed by sequentially laminating a first N type charge generation layer 1515, a first P type charge generation layer 1516, and a second N type charge generation layer 1517.

As illustrated in a circuit diagram for a forward driving of the present disclosure of FIG. 5A, a driving data voltage Vdd of approximately 15 V to 25 V is applied to the blue sub pixel B-sub and the cathode 123 applies a cathode voltage Vss of 0 V to enable the forward driving. Therefore, holes are injected to the first light emitting layer 1513 through the first hole injection layer 1511 and the first hole transport layer 1512 and electrons are injected from the first N type charge generation layer 1515 and the first electron transport layer (ETL) 1514 to the first light emitting layer 1513. Accordingly, electrons and holes are coupled in the first light emitting layer 1513 to generate light. At this time, holes are injected to the second N type charge generation layer 1517 from the first P type charge generation layer 1516 and the electrons are injected to the first P type charge generation layer 1516 from the second N type charge generation layer 1517. Accordingly, electrons and holes generated in the first P type charge generation layer 1516 and the second N type charge generation layer 1517 meet to be cancelled. Therefore, the electrons and holes do not move to the second emission part A so that the emission is not generated in the second emission part A.

The first light emitting layer 1513 may include one of a blue light emitting layer, a deep blue light emitting layer, and a sky blue light emitting layer so that light emitted from the first light emitting layer 1513 according to the forward driving of the blue sub pixel B-sub is emitted through the blue sub pixel B-sub. Accordingly, a blue image with an emission wavelength range of 440 nm to 480 nm may be displayed.

Further, as illustrated in a circuit diagram of reverse driving of the present disclosure of FIG. 5B, a driving data voltage Vdd of approximately −15 V to −25 V is applied to the red sub pixel R-sub, the green sub pixel G-sub, and the white sub pixel W-sub and the cathode 123 applies a cathode voltage Vss of 0 V to enable the reverse driving. By doing this, the electrons are supplied from the second N type charge generation layer 1517 and the second electron transport layer 1518 to the second light emitting layer 1519a, the third light emitting layer 1519b, and the fourth light emitting layer 1519c, and the third hole transport layer 1525 and the fourth hole injection layer 1526 supply the holes to the fifth light emitting layer 1524. At this time, a second hole transport layer 1520, a second P type charge generation layer 1521, a third N type charge generation layer 1522, and a third electron transport layer 1523 are located between the fourth emitting layer 1519c and the fifth light emitting layer 1524 of the second emission part A. The second P type charge generation layer 1521 and the third N type charge generation layer 1522 control charge balance of the second light emitting layer 1519a, the third light emitting layer 1519b, and the fourth light emitting layer 1519c and the fifth light emitting layer 1524.

The second P type charge generation layer 1521 serves to inject holes to the second light emitting layer 1519a, the third light emitting layer 1519b, and the fourth light emitting layer 1519c. The third N type charge generation layer 1522 serves to inject electrons to the fifth light emitting layer 1524. By doing this, after emitting color light from the second light emitting layer 1519a, the third light emitting layer 1519b, the fourth light emitting layer 1519c, and the fifth light emitting layer 1524, respectively, colors are mixed to emit light having a higher luminance.

The second light emitting layer 1519a may include a red light emitting layer having an emission wavelength range of 600 nm to 700 nm and the third light emitting layer 1519b and the fourth light emitting layer 1519c may include a yellow-green light emitting layer having an emission wavelength range of 560 nm to 590 nm. The fifth light emitting layer 1524 may include a blue light emitting layer, a deep blue light emitting layer, or a sky blue light emitting layer having an emission wavelength range of 440 nm to 480 nm.

A device lifespan of the yellow-green light emitting layer is lower than that of the other light emitting layer so that two layers are used to increase the device lifespan.

Light of the second light emitting layer 1519a, the third light emitting layer 1519b, the fourth light emitting layer 1519c, and the fifth light emitting layer 1524 is mixed to generate white light. At this time, holes are injected to the first N type charge generation layer 1515 from the first P type charge generation layer 1516 and the electrons are injected to the first P type charge generation layer 1516 from the first N type charge generation layer 1515. Accordingly, electrons and holes generated in the first P type charge generation layer 1516 and the first N type charge generation layer 1515 meet to be cancelled. Therefore, the electrons and holes do not move to the first emission part B so that the emission is not generated in the first emission part B.

White light generated by the reverse driving of the red sub pixel R-sub, the green sub pixel G-sub, and the white sub pixel W-sub passes through the color filters of the red sub pixel R-sub and the green sub pixel G-sub to display red and green images and passes through the white sub pixel W-sub to display a white image.

Figure 10:
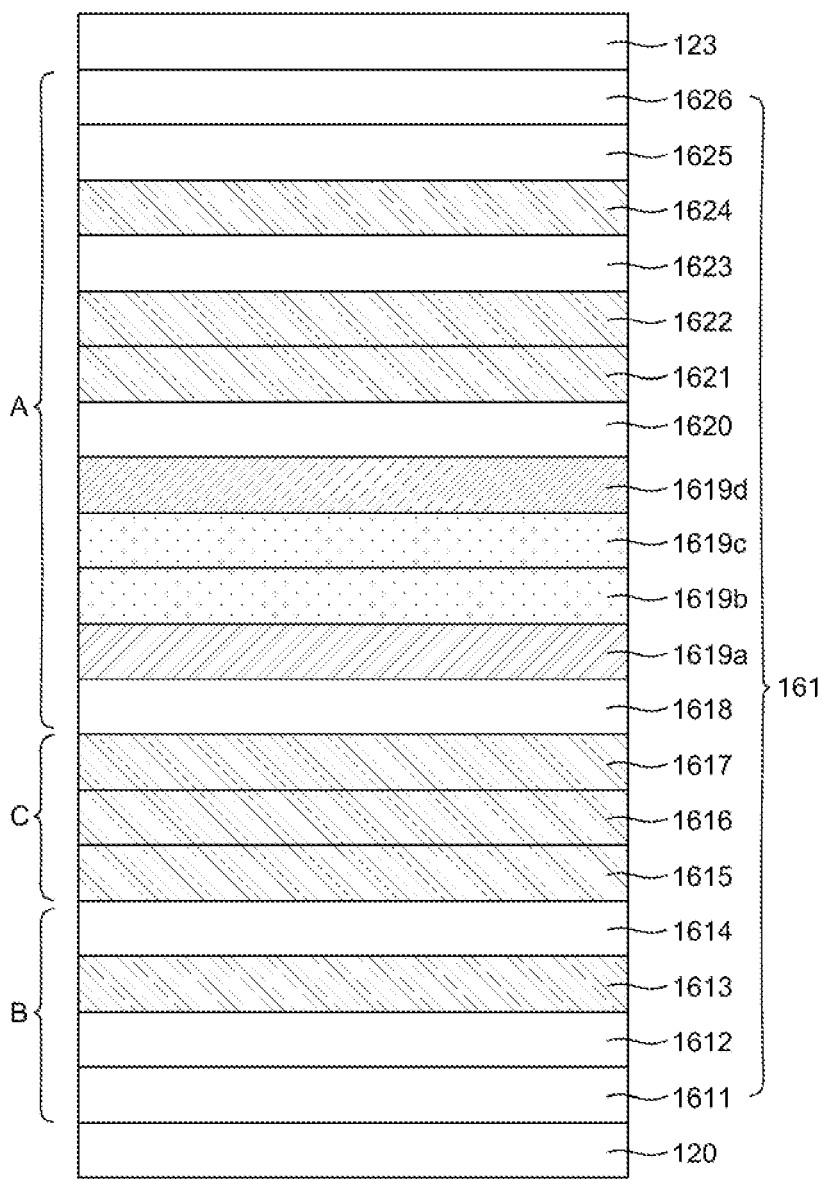
FIG. 10 is a view illustrating a light emitting diode according to a fifth exemplary aspect of the present disclosure.

FIG. 10 is a view illustrating a light emitting diode layer 161 according to a fifth exemplary aspect of the present disclosure.

In the fifth exemplary aspect, the structure and the driving method of the first emission part B are the same as those in the fourth exemplary aspect. In the description of the present exemplary aspect, the description of the same or corresponding components of the previous exemplary aspect may be omitted or briefly performed.

An organic layer 161 includes a first emission part B and a second emission part A and a charge generation layer C may be located between the first emission part B and the second emission part A. The first emission part B may include a first hole injection layer (HIL) 1611, a first hole transport layer (HTL) 1612, a first light emitting layer 1613, and a first electron transport layer (ETL) 1614 on the anode 120.

The second emission part A may include a second electron transport layer (ETL) 1618, a second light emitting layer 1619a, a third light emitting layer 1619b, a fourth light emitting layer 1619c, a fifth light emitting layer 1619d, a second hole transport layer (HTL) 1620, a second P type charge generation layer 1621, a third N-type charge generation layer 1622, a third electron transport layer (ETL) 1623, a fifth light emitting layer 1619d, a third hole transport layer (HTL) 1625, and a fourth hole injection layer (HIL) 1626.

The charge generation layer C may be formed by sequentially laminating a first N type charge generation layer 1615, a first P type charge generation layer 1616, and a second N type charge generation layer 1617.

As illustrated in the circuit diagram for forward driving in the present disclosure of FIG. 5A, a driving data voltage Vdd of approximately 15 V to 25 V is applied to the blue sub pixel B-sub and the cathode 123 applies a cathode voltage Vss of 0 V. Therefore, holes are injected to the first light emitting layer 1613 through the first hole transport layer 1612 and the electrons are injected to the first light emitting layer 1613 from the first N type charge generation layer 1615 and the first electron transport layer (ETL) 1614 so that the electrons and holes are coupled in the first light emitting layer 1613 to generate light. At this time, holes are injected to the second N type charge generation layer 1617 from the first P type charge generation layer 1616 and the electrons are injected to the first P type charge generation layer 1616 from the second N type charge generation layer 1617. Accordingly, electrons and holes generated in the first P type charge generation layer 1616 and the second N type charge generation layer 1617 meet to be cancelled. Therefore, the electrons and holes do not move to the second emission part A so that the emission is not generated in the second emission part A.

The first light emitting layer 1613 may include one of a blue light emitting layer, a deep blue light emitting layer, and a sky blue light emitting layer so that light emitted from the first light emitting layer 1613 according to the forward driving of the blue sub pixel B-sub is emitted through the blue sub pixel B-sub. Accordingly, a blue image with an emission wavelength range of 440 nm to 480 nm may be displayed.

Further, as illustrated in a circuit diagram of reverse driving of the present disclosure of FIG. 5B, a driving data voltage Vdd of −15 V to −25 V is applied to the red sub pixel R-sub, the green sub pixel G-sub, and the white sub pixel W-sub and the cathode 123 applies a cathode voltage Vss of 0 V to enable the reverse driving. By doing this, the electrons are supplied from the second N type charge generation layer 1617 and the second electron transport layer 1618 to the second light emitting layer 1619a, the third light emitting layer 1619b, the fourth light emitting layer 1619c, and the fifth light emitting layer 1619d and the third hole transport layer 1625 and the fourth hole injection layer 1626 supply the holes to the sixth light emitting layer 1624. At this time, a second hole transport layer 1620, a second P type charge generation layer 1621, a third N type charge generation layer 1622, and a third electron transport layer 1623 are located between the fifth light emitting layer 1619b and the sixth light emitting layer 1624 of the second emission part A. The second P type charge generation layer 1621 and the third N type charge generation layer 1622 control charge balance of the second light emitting layer 1619a, the third light emitting layer 1619b, the fourth light emitting layer 1619c, and the fifth light emitting layer 1619d, and the sixth light emitting layer 1624.

The second P type charge generation layer 1621 serves to inject holes to the second light emitting layer 1619a, the third light emitting layer 1619b, the fourth light emitting layer 1619c, and the fifth light emitting layer 1619d. The third N type charge generation layer 1622 serves to inject electrons to the sixth light emitting layer 1624. By doing this, after emitting color light from the second light emitting layer 1619a, the third light emitting layer 1619b, the fourth light emitting layer 1619c, and the fifth light emitting layer 1619d, and the sixth light emitting layer 1624, respectively, colors are mixed to emit light having a higher luminance.

The second light emitting layer 1619a may include a red light emitting layer having an emission wavelength range of 600 nm to 700 nm and the third light emitting layer 1619b and the fourth light emitting layer 1619c may include a yellow-green light emitting layer having an emission wavelength range of 560 nm to 590 nm. The fifth light emitting layer 1619d may include a green light emitting layer having an emission wavelength range of 520 nm to 560 nm and the sixth light emitting layer 1624 may include a blue light emitting layer, a deep blue light emitting layer, or a sky blue light emitting layer having an emission wavelength range of 440 nm to 480 nm.

A device lifespan of the yellow-green light emitting layer is lower than that of the other light emitting layer so that two layers and a green light emitting layer are further used to increase the device lifespan.

Light of the second light emitting layer 1619a, the third light emitting layer 1619b, the fourth light emitting layer 1619c, and the fifth light emitting layer 1619d and the sixth light emitting layer 1624 is mixed to generate white light. At this time, holes are injected to the first N type charge generation layer 1615 from the first P type charge generation layer 1616 and the electrons are injected to the first P type charge generation layer 1616 from the first N type charge generation layer 1615. Accordingly, electrons and holes generated in the first P type charge generation layer 1616 and the first N type charge generation layer 1615 meet to be cancelled. Therefore, the electrons and holes do not move to the first emission part B so that the emission is not generated in the first emission part B.

White light generated by the reverse driving of the red sub pixel R-sub, the green sub pixel G-sub, and the white sub pixel W-sub passes through the color filters of the red sub pixel R-sub and the green sub pixel G-sub to display red and green images and passes through the white sub pixel W-sub to display a white image.

The exemplary aspects of the present disclosure may also be described as follows:

According to an aspect of the present disclosure, there is provided a display apparatus. The display apparatus includes a substrate including an emission area, each pixel in the emission area, a transistor in the each pixel and an anode connected to the transistor and an organic layer and a cathode on the anode, wherein the organic layer includes at least two hole injection layers, one of the at least two hole injection layers is disposed to be adjacent to the anode and the other one of the at least two hole injection layers is disposed to be adjacent to the cathode.

The each pixel may include a first sub pixel, a second sub pixel, and a third sub pixel.

The first sub pixel and the second sub pixel may include a color filter layer between the transistor and the anode.

The third sub pixel may include a blue emission sub pixel.

The first sub pixel and the second sub pixel may perform reverse driving and the third sub pixel may perform forward driving.

The organic layer may include three or more light emitting layers.

Among the three or more light emitting layers, a first light emitting layer may include a blue light emitting layer, a second light emitting layer may include a red light emitting layer, and a third light emitting layer may include a green or yellow-green light emitting layer.

The third light emitting layer may be disposed to be adjacent to the second light emitting layer and a first electron transport layer, a first N type charge generation layer, a first P type charge generation layer, and a second N type charge generation layer may be disposed between the first light emitting layer and the second light emitting layer.

The organic layer may include three or more light emitting layers, a first N type charge generation layer, a first P type charge generation layer, and a second N type charge generation layer may be disposed between a first light emitting layer and a second light emitting layer and a second P type charge generation layer and a third N type charge generation layer may be disposed between the second light emitting layer and a third light emitting layer.

The each pixel may include a first sub pixel, a second sub pixel, a third sub pixel, and a fourth sub pixel.

The first sub pixel, the second sub pixel, and the fourth sub pixel may perform reverse driving and the third sub pixel may perform forward driving.

The organic layer may include four or more light emitting layers.

Among the four or more light emitting layers, a first light emitting layer includes a blue light emitting layer, a second light emitting layer may include a red light emitting layer, a third light emitting layer may include a green or yellow-green light emitting layer, and a fourth light emitting layer may include a blue light emitting layer.

The third light emitting layer may be disposed to be adjacent to the second light emitting layer and a first electron transport layer, a first N type charge generation layer, a first P type charge generation layer, and a second N type charge generation layer may be disposed between the first light emitting layer and the second light emitting layer.

The fourth light emitting layer may be located on the third light emitting layer and a second P type charge generation layer and a third N type charge generation layer may be disposed between the fourth light emitting layer and the third light emitting layer.

The first sub pixel and the second sub pixel may include a color filter layer between the transistor and the anode.

The third sub pixel may include a blue emission sub pixel.

The fourth sub pixel may include a white emission sub pixel.

Among the four or more light emitting layers, a first light emitting layer may include a blue light emitting layer, a second light emitting layer may include a red light emitting layer, a third light emitting layer may include a yellow-green light emitting layer, a fourth light emitting layer may include a yellow-green light emitting layer, and a fifth light emitting layer may include a blue light emitting layer.

Among the four or more light emitting layers, a first light emitting layer may include a blue light emitting layer, a second light emitting layer may include a red light emitting layer, a third light emitting layer may include a yellow-green light emitting layer, a fourth light emitting layer may include a yellow-green light emitting layer, a fifth light emitting layer may include a green light emitting layer, and a sixth light emitting layer may include a blue light emitting layer.

The display apparatus may further include a color filter layer disposed on the first sub pixel and the second sub pixel.

The color filter layer may be an organic material including a color pigment and a dye and a quantum dot material including the color pigment and the dye.

According to another aspect of the present disclosure, there is provided a display apparatus. The display apparatus includes a substrate including an emission area, each pixel in the emission area, a transistor in the each pixel and an anode connected to the transistor and an organic layer and a cathode on the anode, wherein the organic layer includes a first emission part, a second emission part, and a charge generation layer, the charge generation layer includes a first N type charge generation layer, a first P type charge generation layer, and a second N type charge generation layer, the first emission part includes a first light emitting layer, a first hole injection layer, and a first electron transport layer, and the second emission part includes a second light emitting layer, the second hole injection layer, and a second electron transport layer, and the first light emitting layer, the first hole injection layer, and the first electron transport layer and the second light emitting layer, the second hole injection layer, and the second electron transport layer are laminated to be symmetrical to each other with respect to the charge generation layer.

The each pixel may include a first sub pixel, a second sub pixel, and a third sub pixel.

The first sub pixel and the second sub pixel may include a color filter layer between the transistor and the anode.

The third sub pixel may include a blue emission sub pixel.

The first sub pixel and the second sub pixel may perform reverse driving and the third sub pixel may perform forward driving.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a substrate including an emission area;
a plurality of pixels disposed on the substrate in the emission area;
a transistor in each of the plurality of pixels and an anode connected to the transistor; and
an organic layer and a cathode on the anode,
wherein the organic layer includes a first emission part, a charge generation layer on the first emission part, and a second emission part on the charge generation layer,
wherein the first emission part emits light when a reverse driving is performed to the organic layer, and
wherein the second emission part emits light when a forward driving is performed to the organic layer.

2. The display apparatus according to claim 1, wherein each of the plurality of pixels includes a first sub pixel, a second sub pixel, a third sub pixel, and a fourth sub pixel.

3. The display apparatus according to claim 1, wherein each of the plurality of pixels includes a first sub pixel, a second sub pixel, and a third sub pixel.

4. The display apparatus according to claim 3, further comprising a color filter disposed in each of the first sub pixel and the second sub pixel.

5. The display apparatus according to claim 3, wherein the third sub pixel is a blue emission sub pixel.

6. The display apparatus according to claim 3, wherein the first sub pixel and the second sub pixel are a red emission sub pixel and a green emission sub pixel, respectively.

7. The display apparatus according to claim 3, wherein the first emission part includes a first light emitting layer, and the second emission part includes a second light emitting layer and a third light emitting layer.

8. The display apparatus according to claim 3, further comprising a color filter layer disposed on the first sub pixel and the second sub pixel.

9. The display apparatus according to claim 7, wherein the first light emitting layer is a blue light emitting layer, the second light emitting layer is a red light emitting layer, and the third light emitting layer is a green or yellow-green light emitting layer.

10. The display apparatus according to claim 9, wherein the third light emitting layer is adjacent to the second light emitting layer and a first electron transport layer, a first N type charge generation layer, a first P type charge generation layer, and a second N type charge generation layer are disposed between the first light emitting layer and the second light emitting layer.

11. The display apparatus according to claim 3, further comprising a first N type charge generation layer, a first P type charge generation layer, and a second N type charge generation layer disposed between a first light emitting layer and a second light emitting layer, and a second P type charge generation layer and a third N type charge generation layer disposed between the second light emitting layer and a third light emitting layer.

12. The display apparatus according to claim 2, wherein the first sub pixel, the second sub pixel, and the fourth sub pixel display different colors by using light emitted from the second emission part.

13. The display apparatus according to claim 2, wherein the first emission part includes a first light emitting layer, and the second emission part includes a second light emitting layer, a third light emitting layer and a fourth emitting layer.

14. The display apparatus according to claim 13, wherein the first light emitting layer is a blue light emitting layer, the second light emitting layer is a red light emitting layer, the third light emitting layer is a green or yellow-green light emitting layer, and the fourth light emitting layer is a blue light emitting layer.

15. The display apparatus according to claim 14, wherein the third light emitting layer is adjacent to the second light emitting layer and a first electron transport layer, a first N type charge generation layer, a first P type charge generation layer, and a second N type charge generation layer are disposed between the first light emitting layer and the second light emitting layer.

16. The display apparatus according to claim 15, wherein the fourth light emitting layer is located on the third light emitting layer and a second P type charge generation layer and a third N type charge generation layer are disposed between the fourth light emitting layer and the third light emitting layer.

17. The display apparatus according to claim 2, further comprising a color filter disposed in each of the first sub pixel and the second sub pixel.

18. The display apparatus according to claim 2, wherein the third sub pixel is a blue emission sub pixel.

19. The display apparatus according to claim 2, wherein the fourth sub pixel is a white emission sub pixel.

20. The display apparatus according to claim 13, wherein the first light emitting layer is a blue light emitting layer, the second light emitting layer is a red light emitting layer, the third light emitting layer is a yellow-green light emitting layer, the fourth light emitting layer is a yellow-green light emitting layer, and
wherein the second emission part further includes a fifth light emitting layer, and the fifth light emitting layer is a blue light emitting layer.

21. The display apparatus according to claim 13, wherein among four or more light emitting layers, the first light emitting layer includes a blue light emitting layer, the second light emitting layer includes a red light emitting layer, the third light emitting layer includes a yellow-green light emitting layer, the fourth light emitting layer includes a yellow-green light emitting layer, a fifth light emitting layer includes a green light emitting layer, and a sixth light emitting layer includes a blue light emitting layer.

22. The display apparatus according to claim 8, wherein the color filter layer is an organic material including a color pigment and a dye and a quantum dot material including the color pigment and the dye.

23. A display apparatus, comprising:
a substrate including an emission area;
a plurality of pixels disposed on the substrate in the emission area;
a transistor in each of the plurality of pixels and an anode connected to the transistor; and
an organic layer and a cathode on the anode,
wherein the organic layer includes a first emission part, a second emission part, and a charge generation layer,
the charge generation layer includes a first N type charge generation layer, a first P type charge generation layer, and a second N type charge generation layer,
the first emission part includes a first light emitting layer, a first hole injection layer, and a first electron transport layer, and the second emission part includes a second light emitting layer, a second hole injection layer, and a second electron transport layer, and
the first light emitting layer, the first hole injection layer, and the first electron transport layer and the second light emitting layer, the second hole injection layer, and the second electron transport layer are laminated to be symmetrical to each other with respect to the charge generation layer.

24. The display apparatus according to claim 23, wherein each of the plurality of pixels includes a first sub pixel, a second sub pixel, and a third sub pixel.

25. The display apparatus according to claim 24, further comprising a color filter is disposed in each of the first sub pixel and the second sub pixel.

26. The display apparatus according to claim 24, wherein the third sub pixel is a blue emission sub pixel.

27. The display apparatus according to claim 24, wherein the first sub pixel and the second sub pixel perform reverse driving and the third sub pixel display different colors by using light emitted from the second emission part.

\*  \*  \*  \*  \*